US 9,335,393 B2

(12) United States Patent
Jin et al.

(10) Patent No.: US 9,335,393 B2
(45) Date of Patent: May 10, 2016

(54) MR PARALLEL IMAGING SYSTEM REDUCING IMAGING TIME

(71) Applicants: Ning Jin, Powell, OH (US); Debiao Li, South Pasedena, CA (US); Qi Liu, Los Angeles, CA (US); Sven Zuehlsdorff, Westmont, IL (US)

(72) Inventors: Ning Jin, Powell, OH (US); Debiao Li, South Pasedena, CA (US); Qi Liu, Los Angeles, CA (US); Sven Zuehlsdorff, Westmont, IL (US)

(73) Assignees: Siemens Medical Solutions USA, Inc., Malvern, PA (US); Cedars-Sinai Medical Center, Los Angeles, CA (US)

(*) Notice: Subject to any disclaimer, the term of this patent is extended or adjusted under 35 U.S.C. 154(b) by 539 days.

(21) Appl. No.: 13/852,206

(22) Filed: Mar. 28, 2013

(65) Prior Publication Data

US 2014/0070803 A1    Mar. 13, 2014

Related U.S. Application Data

(60) Provisional application No. 61/700,364, filed on Sep. 13, 2012.

(51) Int. Cl.
| | |
|---|---|
| G01V 3/00 | (2006.01) |
| G01R 33/54 | (2006.01) |
| G01R 33/56 | (2006.01) |
| G01R 33/561 | (2006.01) |

(52) U.S. Cl.
CPC ............ *G01R 33/54* (2013.01); *G01R 33/5605* (2013.01); *G01R 33/5611* (2013.01)

(58) Field of Classification Search
CPC ...................................................... G01R 33/54

USPC .......................................... 324/309, 307, 306
See application file for complete search history.

(56) References Cited

U.S. PATENT DOCUMENTS

| 7,610,077 B2 | 10/2009 | Dixon et al. | |
|---|---|---|---|
| 8,278,925 B2* | 10/2012 | Sun et al. ...................... | 324/308 |
| 2007/0134159 A1 | 6/2007 | Dixon et al. | |

(Continued)

FOREIGN PATENT DOCUMENTS

| CN | 101846731 A | 9/2010 |
|---|---|---|
| CN | 102210587 A | 10/2011 |

(Continued)

OTHER PUBLICATIONS

K.M. Ward et al., "A New Class of Contrast Agents for MRI Based on Proton Chemical Exchange Dependent Saturation Transfer (CEST)", Journal of Magnetic Resonance 143, 79-87 (2000).

(Continued)

*Primary Examiner* — Louis Arana
(74) *Attorney, Agent, or Firm* — Peter R. Withstandley (57) ABSTRACT

An MR imaging system uses multiple RF coils, for reducing image acquisition time, suitable for chemical exchange saturation transfer (CEST) imaging. Multiple RF (Radio Frequency) coils provide CEST imaging preparation in an anatomical volume by providing multiple interleaved RF pulses. The multiple interleaved RF pulses provide substantially increased RF pulse sequence duty cycle in the multiple RF coils relative to a duty cycle provided by a single coil of the multiple RF coils. The multiple RF coils subsequently provide RF excitation pulses in a reduced anatomical volume using k-space undersampling in an accelerated imaging method using the multiple RF coils and enable subsequent acquisition of associated RF echo data for deriving a CEST image.

11 Claims, 7 Drawing Sheets

(56) References Cited

U.S. PATENT DOCUMENTS

| | | | |
|---|---|---|---|
| 2010/0286502 | A1 | 11/2010 | Van Zijl et al. |
| 2012/0019245 | A1 | 1/2012 | Reddy et al. |
| 2012/0271159 | A1 | 10/2012 | Song et al. |
| 2013/0342207 | A1* | 12/2013 | Keupp et al. .......... 324/309 |
| 2015/0077110 | A1* | 3/2015 | Miyoshi .......... 324/309 |

FOREIGN PATENT DOCUMENTS

| | | |
|---|---|---|
| CN | 102257399 A | 11/2011 |
| CN | 102365559 A | 2/2012 |
| WO | 2011091365 A1 | 7/2011 |

OTHER PUBLICATIONS

Jinyuan Zhou, et al., "Using the amide proton signals of intracellular proteins and peptides to detect pH effects in MRI", Nature Medicine, vol. 9, No. 8, Aug. 2003.

Weng Ling, et al., "Assessment of glycosaminoglycan concentration in vivo by chemical exchange-dependent saturation transfer (gagCEST)", PNAS, vol. 105, No. 7, Feb. 19, 2008.

Jinyuan Zhou, et al., "Amide Proton Transfer (APT) Contrast for Imaging of Brain Tumors", Magnetic Resonance in Medicine 50:1120-1126 (2003).

Peter C M Van Zijl, et al., "MRI detection of glycogen in vivo by using chemical exchange saturation transfer imaging (glycoCEST)", PNAS, vol. 104, No. 11, pp. 4359-4364, Mar. 13, 2007.

W. Thoams Dixon, et al., "A Multislice Gradient Echo Pulse Sequence for CEST Imaging", Magnetic REsonance in Medicine 63:253-256 (2010).

Benjamin Schmitt, et al., "Optimization of Pulse Train Presaturation for CEST Imaging in Clinical Scanners", Magnetic Resonance in Medicine 65:1620-1629 (2011).

John Pauly, et al, "A k-Space Analysis of Small-Tip-Angle_Excitation", Journal of Magnetic Resonance 81, 43-56 (1989).

Ulrich Katscher, et al., "Transmit SENSE", Magnetic Resonance in Medicine 49:144-150 (2003).

William Grissom, et al., "A New Method for the Design of RF Pulses in Transmit SENSE", Proceedings of the 2nd International Workshop on Parallel Imaging,, Zurich, Switzerland 2004, p. 95.

Kawin Setsompop, et al., "Parallel RF Transmission With Eight Channels at 3 Tesla", Magnetic Resonance in Medicine 56:1163-1171 (2006).

David A Feinberg, et al., "Inner Volume MR Imaging: Technical Concepts and Their Application", Radiology, Sep. 1985.

Christopher J Hardy and Harvey E Cline, "Spatial Localization in Two Dimensions Using NMR Designer Pulses", Journal of Magnetic Resonance 82, 647-654 (1989).

Chinese Office Action dated Aug. 3, 2015 in CN Application No. 201310692828.3, 14 pages (English translation attached).

\* cited by examiner

MR PARALLEL IMAGING SYSTEM REDUCING IMAGING TIME

CROSS-REFERENCE TO RELATED APPLICATIONS

This application is a non-provisional of, and claims priority to, U.S. provisional patent application Ser. No. 61/700,364 by N. Jin et al. filed on 13 Sep. 2012.

FIELD OF THE INVENTION

This invention concerns an MR imaging system using multiple RF coils, for reducing image acquisition time, suitable for chemical exchange saturation transfer (CEST) imaging, using interleaved RF pulses providing substantially increased RF pulse sequence duty cycle in the RF coils relative to a duty cycle provided by a single coil of the RF coils.

BACKGROUND OF THE INVENTION

A chemical exchanged saturation transfer (CEST) method utilizes a train of high-power radiofrequency (RF) saturation pulses that are applied at the resonance frequency of exchangeable protons, after which saturation is transferred through chemical exchange to a bulk water pool leading to MR signal loss that yields contrast. Known systems employ the CEST method to image tissue pH, to assess glycosaminoglycan concentration in cartilage, to map brain protein through —NH chemical residues and to monitor glycogen concentration in the liver.

Saturation may be achieved by applying a continuous RF pulse with long duration. Increasing the length of the RF pulse typically increases the CEST effect. However, technical constraints, such as limited pulse width and duty-cycle limit its application on MR clinical scanners. Pulsed train RF saturation may be used, but the available duty cycle limits the achievable CEST effect. In order to analyze the CEST effect, multiple MR images are acquired with saturation pulses at different resonance frequencies that include the specific resonance frequency associated with the solute of interest. A measurement for the saturation effect is the ratio between the signals of saturated water (S) and signal of water without saturation ($S_0$). CEST contrast may be quantified by calculating its asymmetry in magnetization transfer ratio ($MTR_{asym}$) at the frequency of the exchangeable protons ($\Delta\omega$): $MTR_{asym}=(S(-\Delta\omega))-S(+\Delta\omega))/S_0$. The necessity to acquire multiple images typically renders CEST imaging time-consuming. Furthermore due to a long acquisition time, in vivo acquisition is susceptible to motion artifacts. Most known system CEST imaging is conducted on a high-field (>=3T) MRI scanner, since at high field the larger chemical shift dispersion permits a clearer delineation of the CEST effect and the prolonged T1 of water protons leads to a longer lifetime of saturated spins after saturation transfer from a CEST agent to bulk water. However it exacerbates the CEST sensitivity to radiofrequency field ($B_1$) inhomogeneities. Known CEST imaging methods are burdened by prohibitively long scan times. A system according to invention principles addresses this deficiency and related problems.

SUMMARY OF THE INVENTION

An imaging system increase a Chemical Exchange Saturation Transfer (CEST) effect by using parallel transmission (pTX) introducing advantageous CEST saturation and reducing a total imaging time and motion artifacts by using reduced FOV (Field of View) imaging. An MR imaging system uses multiple RF coils, for reducing image acquisition time, suitable for chemical exchange saturation transfer (CEST) imaging. Multiple RF (Radio Frequency) coils provide CEST imaging preparation in an anatomical volume by providing multiple interleaved RF pulses. The multiple interleaved RF pulses provide substantially increased RF pulse sequence duty cycle in the multiple RF coils relative to a duty cycle provided by a single coil of the multiple RF coils. The multiple RF coils subsequently provide RF excitation pulses in a reduced anatomical volume using k-space undersampling in an accelerated imaging method using the multiple RF coils and enable subsequent acquisition of associated RF echo data for deriving a CEST image.

BRIEF DESCRIPTION OF THE DRAWINGS

FIG. 2(a) shows a known RF saturation pulse sequence comprising a series of Gaussian-shape RF pulses in the time domain with pulse width=100 ms and pulse delay=100 ms, FIG. 2(b) shows a system RF saturation pulse sequence comprising two independent interleaved RF channels, each having a pulse width=100 ms and a pulse delay=100 ms, FIG. 2(c) shows T2 decay of spin ensemble with time constant 80 ms, FIG. 2(d) shows convolution of functions in FIGS. 2(a) and 2(c), FIG. 2(e) shows convolution of functions in FIGS. 2(b) and 2(c), FIGS. 2(f), 2(g) show Fourier transform of functions in FIGS. 2(a) and 2(b), FIG. 2(h) shows a Lineshape function, FIGS. 2(i), 2(j) show Fourier transforms of the convolution function in FIGS. 2(d) and 2(e) equals the product of 2(f) and 2(h) and the product of 2(g) and 2(h), respectively, according to an embodiment of the invention.

DETAILED DESCRIPTION OF THE INVENTION

A system advantageously improves a CEST saturation effect, shortens total imaging time and reduces its sensitivity to B1 (RF) field artifacts. The imaging system increases a Chemical Exchange Saturation Transfer (CEST) effect by using parallel transmission (pTX) to introduce advantageous CEST saturation and reduce a total imaging time and motion artifacts by using reduced FOV (Field of View) imaging. The system provides a CEST imaging method clinically usable without prohibitively long scan times. In one embodiment, the system advantageously interleaves RF pulses to increase CEST saturation efficiency in combination with use of transmit sensitivity encoding (SENSE) to reduce image data acquisition time. Transmit SENSE reduces acquisition time by exploiting the spatial information contained in an individual coil's sensitivity profile. The system employs a parallel transmission (pTX) method for CEST imaging, providing an advantageous saturation scheme to improve the CEST saturation effect and applying reduced field-of-view (FOV) imaging using pTX to selectively excite a small region of interest and hence reduces total acquisition time, motion artifacts and B1 inhomogeneities.

Figure 1:
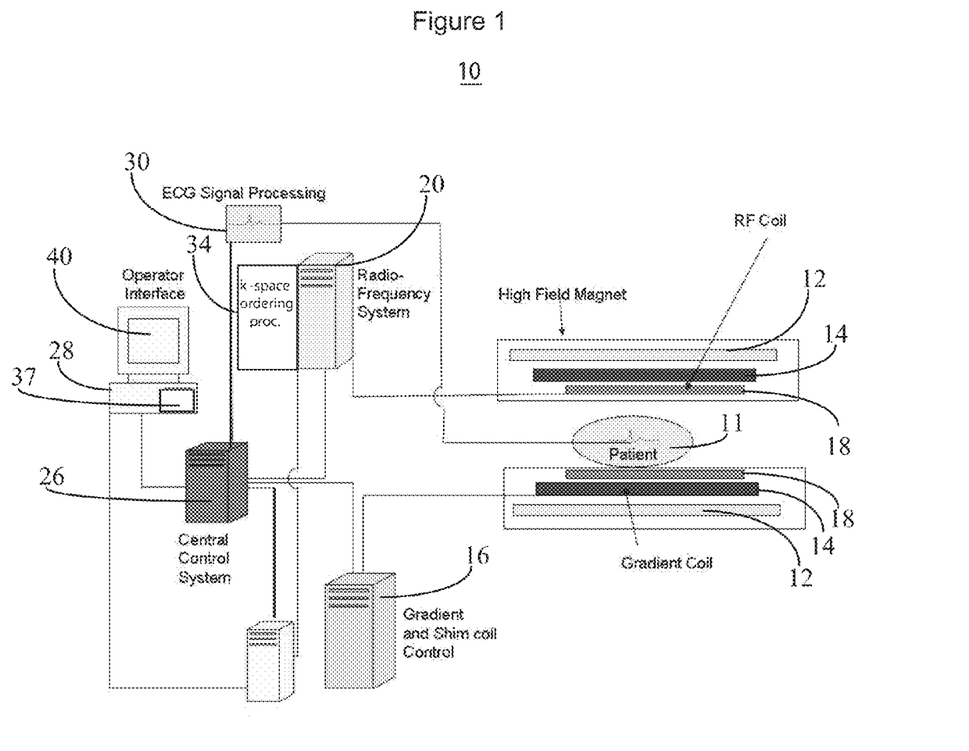
FIG. 1 shows an MR imaging system using multiple RF coils for reducing image acquisition time, suitable for chemical exchange saturation transfer (CEST) imaging, according to an embodiment of the invention.

FIG. 1 shows MR imaging system 10 using multiple RF coils for reducing image acquisition time, suitable for chemical exchange saturation transfer (CEST) imaging. In system 10, magnet 12 creates a static base magnetic field in the body of patient 11 to be imaged and positioned on a table. Within the magnet system are gradient coils 14 for producing position dependent magnetic field gradients superimposed on the static magnetic field. Gradient coils 14, in response to gradient signals supplied thereto by a gradient and shimming and pulse sequence control module 16, produce position dependent and shimmed magnetic field gradients in three orthogonal directions and generates magnetic field pulse sequences. The shimmed gradients compensate for inhomogeneity and variability in an MR imaging device magnetic field resulting from patient anatomical variation and other sources. The magnetic field gradients include a slice-selection gradient magnetic field, a phase-encoding gradient magnetic field and a readout gradient magnetic field that are applied to patient 11.

Further RF (radio frequency) module 20 provides RF pulse signals to RF coils 18, which in response produces magnetic field pulses which rotate the spins of the protons in the imaged body 11 by ninety degrees or by one hundred and eighty degrees for so-called "spin echo" imaging, or by angles less than or equal to 90 degrees for so-called "gradient echo" imaging. In one embodiment, RF coils 18 comprise a subset or substantially all of, multiple RF coils arranged in sections along the length of body 11 corresponding to the length of a patient. Further, an individual section RF coil of coils 18 comprises multiple RF coils providing RF image data that is used in parallel to generate a single MR image. Pulse sequence control module 16 in conjunction with RF module 20 as directed by central control unit 26, control slice-selection, phase-encoding, readout gradient magnetic fields, radio frequency transmission, and magnetic resonance signal detection, to acquire magnetic resonance signals representing planar slices of patient 11.

Multiple individual RF coils of RF coils 18 provide CEST imaging preparation in an anatomical volume by providing corresponding multiple interleaved RF excitation pulses. The multiple interleaved RF excitation pulses provide substantially increased RF pulse sequence duty cycle in the multiple RF coils relative to a duty cycle provided by a single coil of the multiple RF coils 18. RF coils 18 subsequently provide RF excitation pulses in a reduced anatomical volume using k-space undersampling in an accelerated imaging method using the multiple RF coils and enable subsequent acquisition of associated RF echo data for deriving a CEST image. Magnetic field gradient coils 14 generate anatomical volume select magnetic field gradients for phase encoding and readout RF data acquisition in the reduced anatomical volume.

In response to applied RF pulse signals, the RF coil 18 receives MR signals, i.e., signals from the excited protons within the body as they return to an equilibrium position established by the static and gradient magnetic fields. The MR signals are detected and processed by a detector within RF module 20 and k-space component processor unit 34 to provide image representative data to an image data processor in central control unit 26. ECG synchronization signal generator 30 provides ECG signals used for pulse sequence and imaging synchronization. A two or three dimensional k-space storage array of individual data elements in unit 34 stores corresponding individual frequency components comprising an MR dataset. The k-space array of individual data elements has a designated center and individual data elements individually have a radius to the designated center.

Figure 2:
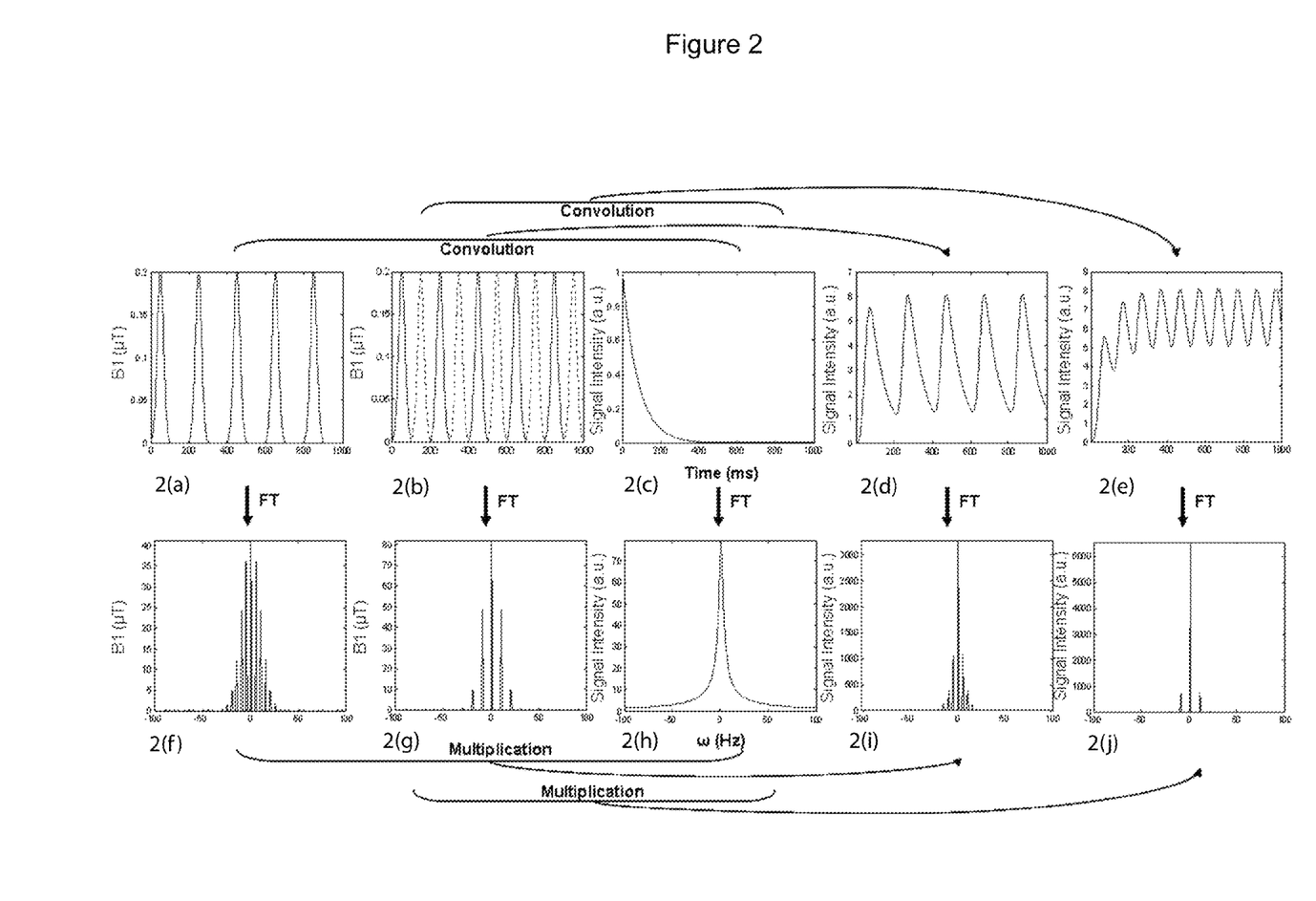

FIG. 2(a) shows a known RF saturation pulse sequence comprising a series of Gaussian-shape RF pulses in the time domain with pulse width=100 ms and pulse delay=100 ms, FIG. 2(b) shows a system 10 (FIG. 1) RF saturation pulse sequence comprising two independent interleaved RF channels, each having a pulse width=100 ms and a pulse delay=100 ms, FIG. 2(c) shows T2 decay of spin ensemble with time constant 80 ms, FIG. 2(d) shows convolution of functions in FIGS. 2(a) and 2(c), FIG. 2(e) shows convolution of functions in FIGS. 2(b) and 2(c), FIGS. 2(f), 2(g) show Fourier transform of functions in FIGS. 2(a) and 2(b) respectively, FIG. 2(h) shows a Lineshape function, FIGS. 2(i), 2(j) show Fourier transforms of the convolution functions in FIGS. 2(d) and 2(e) respectively and equal the product of 2(f) and 2(h) and the product of 2(g) and 2(h), respectively. Fewer frequency peaks are observed in (j) and thus less energy is dispersed in the neighboring frequency domain.

A pulsed train of saturation RF pulses is normally used to induce CEST effect on an MR clinical scanner instead of continuous wave RF pulses due to the limited width of RF pulses ($t_p$) and duty cycle, defined as $\eta = t_p/T$, in which T is the period of the pulse train. Commonly a series of Gaussian-shape RF pulses in the time domain with maximum $t_p$=100 ms and a pulse delay $t_d$=100 ms is used on a Siemens scanner, for example, resulting in duty cycle $\eta$=50% and T=200 ms as shown in FIG. 2(a). Spectral properties of a saturation pulse train are expressed as a response function of a spin system in the frequency domain, i.e., the Fourier transform of the time-varying transition RF saturation rate of the solute protons ($R^s_{RF}(t)$), which equals the product of the Fourier transforms of line shape function and RF power. With an infinite train of RF pulses, the distance between neighboring peaks in the frequency domain is inversely proportional to the period of T of the pulse train: $\omega_0 = 2\pi/T$.

System 10 uses two-channel (2 RF coils) parallel excitation to provide an advantageous RF saturation method overcoming hardware limitations and enhancing CEST contrast. Each of the channels uses its maximum RF pulse width and duty cycle with a pulse width=100 ms and a pulse delay=100 ms. Since the two RF channels are independent, they do not have to deliver RF power at the same time and RF excitation from each channel is interleaved without exceeding the duty cycle for each channel while efficiently providing magnetization saturation. A 100 ms delay is added between the two RF channels. Channel 1 delivers RF energy for 100 ms and recovers for 100 ms while channel 2 is delivering RF energy. By interleaving the two channels, the duty cycle of the pulse train increases to 100% and the period of the pulse train decreases to 100 ms. Compared to a single channel excitation, the distance between neighboring peaks is doubled and peak number is reduced by half in the same frequency range, thus less energy is dispersed in a neighboring frequency domain. As a result, the system 10 two-channel independent RF saturation provides more efficient CEST image contrast. The increased duty cycle further accelerates the CEST effect in reaching its peak. This is especially valuable for fast-exchanging protons.

Figure 3:
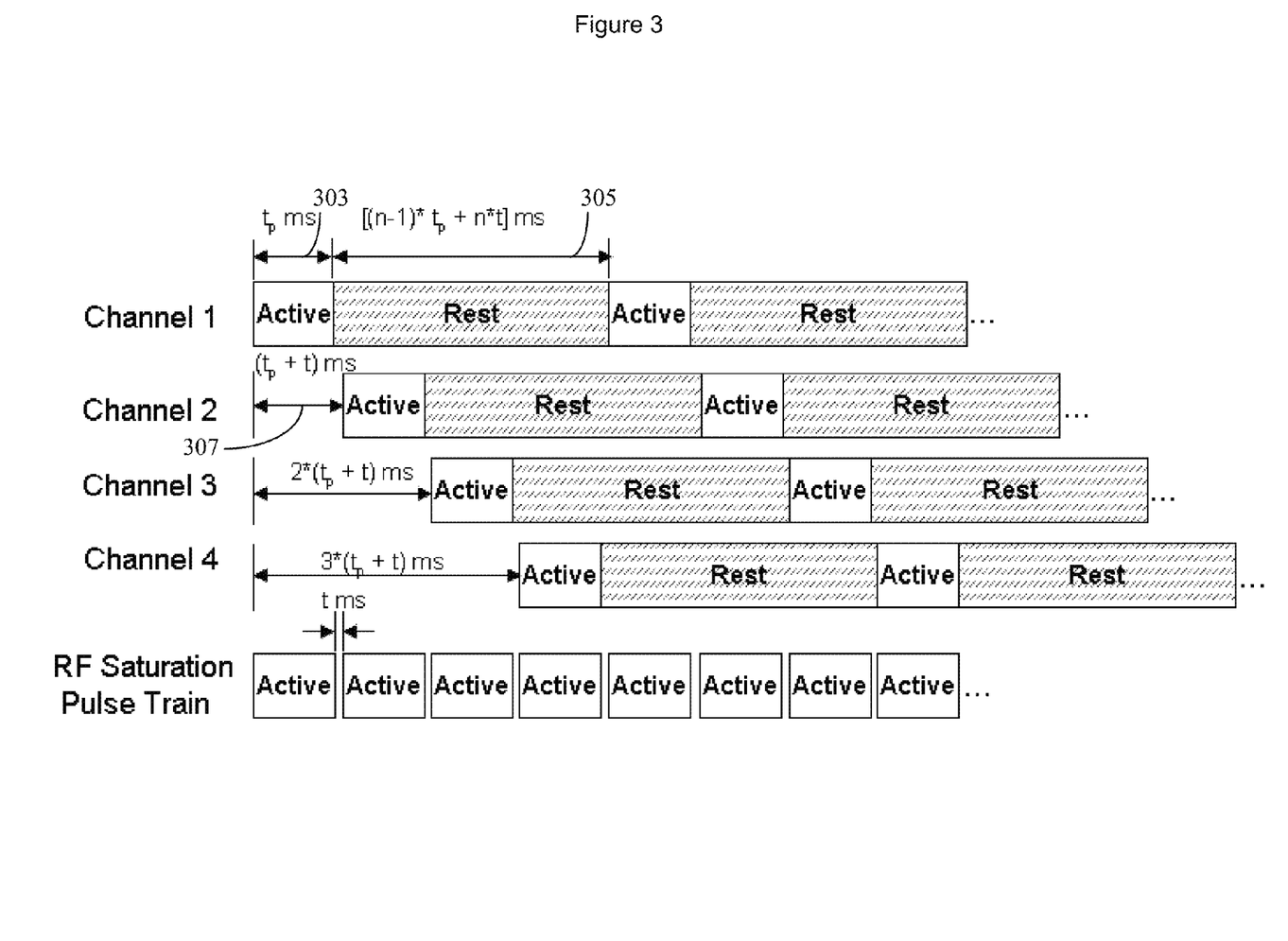
FIG. 3 shows an RF saturation pulse sequence using parallel RF coils of n independent RF channels, according to an embodiment of the invention.

FIG. 3 shows an RF saturation pulse sequence using parallel RF coils comprising n independent RF channels of a pTX system. The CEST saturation method is extended to the pTX system with more than two independent RF channel. In a pTX system with n RF channels, each channel uses a pulse width of $t_p$ ms (303) and a pulse delay of $[(n-1)*t_p+n*t]$ ms (305), in which $0 \le t \le t_p$. Each channel is $(t_p+t)$ ms (307) delayed from a previous channel. As the result, the period of the saturation pulse train $(t_p+t)$ 307 and its duty cycle becomes $t_p/(t_p+t)$. By choosing $t_p=100$ ms and t=0 ms, the period of the saturation pulse train reaches the maximum pulse width of the individual RF channel and its duty cycle is increased from the maximum duty cycle of an individual RF channel to up to 100% and is no longer limited by the individual duty cycle.

Figures 4A, 4B:
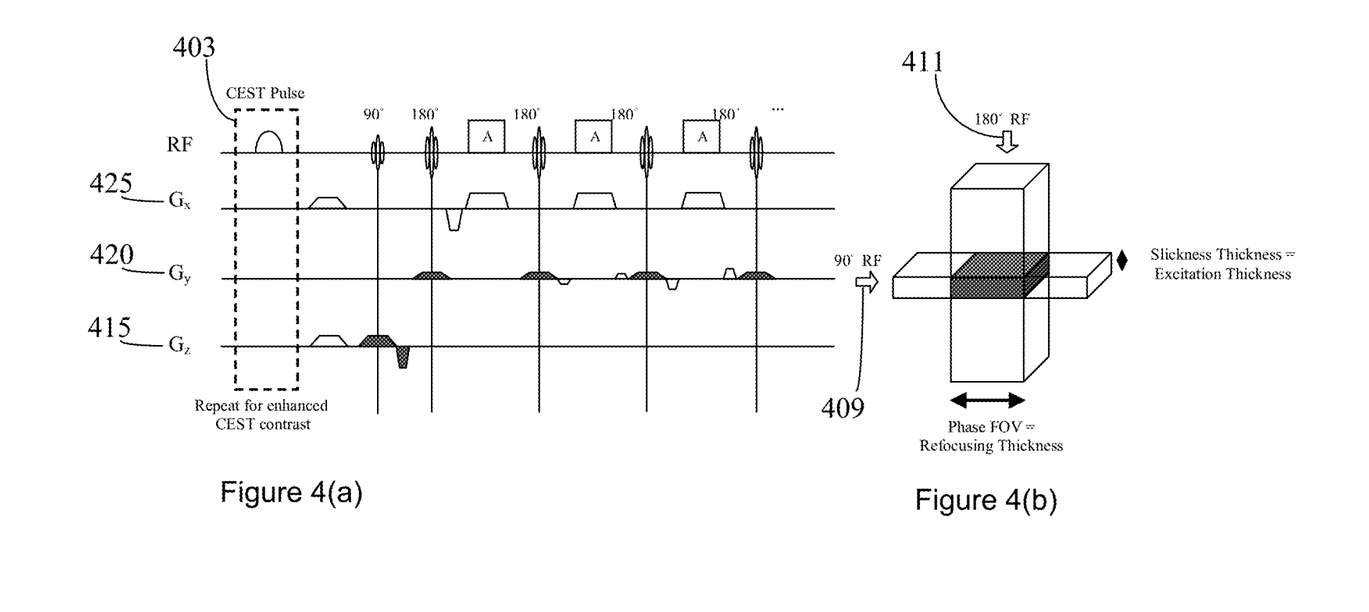
FIG. 4(a) shows a chemical exchanged saturation transfer (CEST) prepared turbo-spin-echo (TSE) pulse sequence and FIG. 4(b) shows inner volume imaging (IVI), for reduced-FOV (Field of View) imaging, according to an embodiment of the invention.

FIG. 4(a) shows a chemical exchanged saturation transfer (CEST) prepared turbo-spin-echo (TSE) pulse sequence and FIG. 4(b) illustrates inner volume imaging (IVI) for reduced-FOV (Field of View) imaging. A segment of k-space is acquired using TSE readout following a train of spectrally selective Gaussian saturation pulses. An IVI method is advantageously integrated with the CEST-TSE sequence to enable reduced FOV image data acquisition. System 10 (FIG. 1) uses a pTX method for reduced FOV CEST imaging providing a reduced FOV in CEST imaging using a CEST prepared turbo-spin-echo (CEST-TSE) sequence combined with inner volume imaging (IVI). A segment of k-space is acquired using TSE readout following a train of spectrally selective Gaussian saturation pulses.

The CEST-TSE sequence combines a CEST preparation comprising a series of spectrally-selective CEST saturation pulses 403 with TSE readout and an IVI method. The slice-selective gradient (Gx 415) for the 90 excitation pulse is applied along a slice-selective direction 409, while the slice-selective gradients for the 180° refocusing pulses (Gy 420, GZ 425) are applied along phase-encoding (PE) direction 411 to provide a limited FOV along the phase-encoding direction. Slice-selective gradient (Gx 415) for the 90° excitation pulse is applied orthogonally to the slice-selective gradients (Gy 420, GZ 425) for the 180° refocusing pulses to provide a limited FOV. An MR signal is formed in the overlapping region between the two selective excitation pulses. The perpendicular orientation of the slice-selective gradients limits the FOV along the PE direction with MR signal limited to being generated within the overlapping central region. The amplitude of the slice-selective gradient for the 180° refocusing RF pulses controls the phase-encoding FOV. The IVI method enables a reduction of FOV along the phase-encoding direction, hence reducing requisite phase-encoding steps and total acquisition time.

Figure 5:
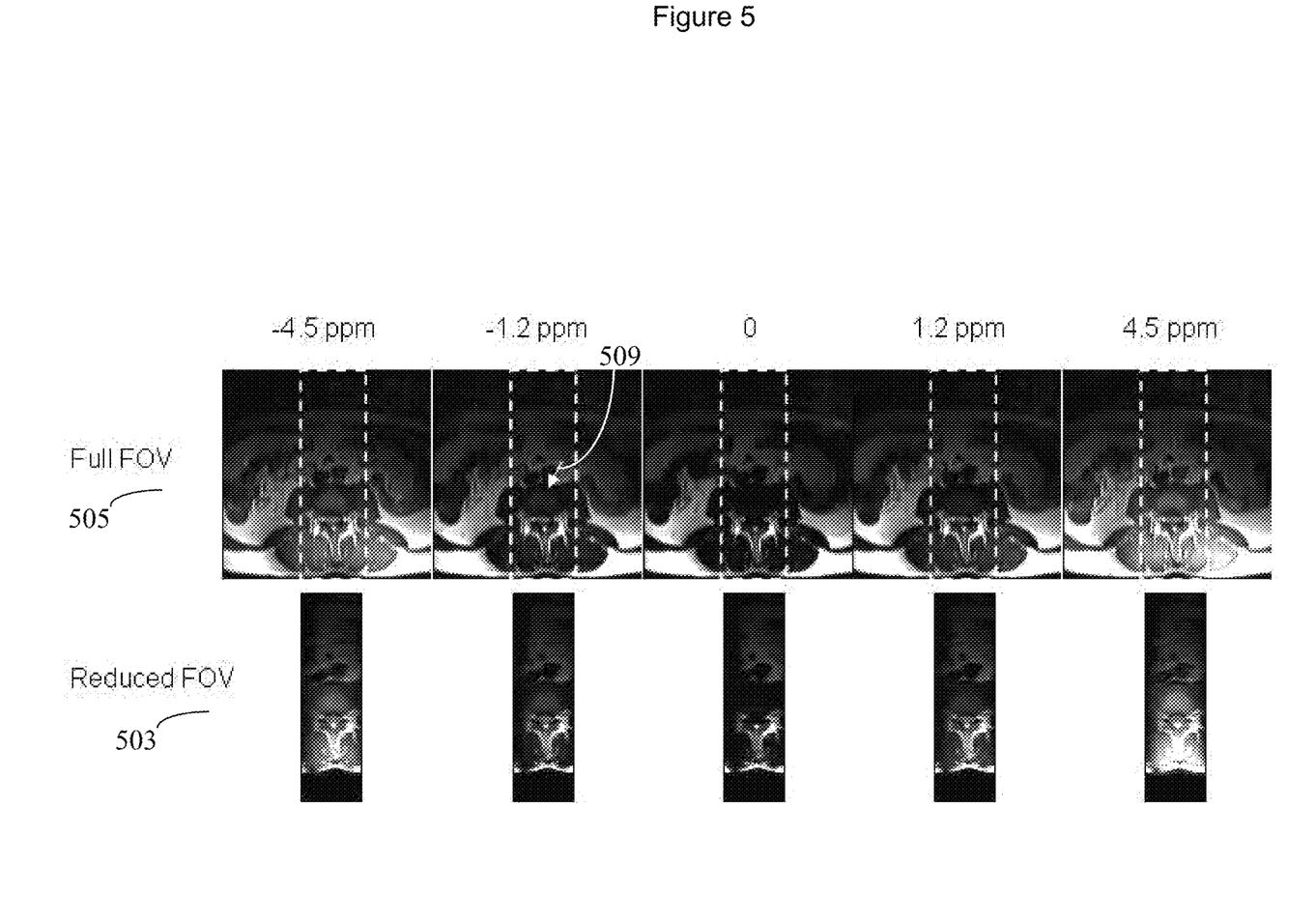
FIG. 5 shows spinal cord images acquired using CEST-TSE with full-FOV and reduced-FOV at saturation frequencies: −4.5 ppm (parts per million), −1.2 ppm, 0 ppm, 1.2 ppm and 4.5 ppm, according to an embodiment of the invention.

FIG. 5 shows spinal cord images acquired using the CEST-TSE pulse sequence of FIG. 4 with full-FOV (505) and reduced-FOV (503) at saturation frequencies: −4.5 ppm (parts per million), −1.2 ppm, 0 ppm, 1.2 ppm and 4.5 ppm. The images are acquired on a 3.0 T MR scanner (MAGNETOM Verio, Siemens Medical Solutions, Erlangen, Germany). The sequence parameters include, TE/TR=8.9/2500 ms, slice thickness=3 mm, echo-train-length=32, bandwidth=300 Hz/pixel, in-plane resolution=1.8×1.8 mm$^2$. Also 31 images are acquired by varying the center saturation frequency of the CEST pulse train (−4.5 ppm~4.5 ppm, with 0.3 ppm interval). A total of 128 phase-encoding lines are acquired in full FOV acquisitions with the total acquisition=310 seconds, while 32 phase-encoding lines were acquired in the reduced-FOV acquisitions, resulting in a reduction of acquisition time by a factor of ¾ compared to the full-FOV imaging. Motion artifacts are observed in the full-FOV image acquired at −1.2 ppm (arrow 509) caused by bowel movements. Compared with a known full FOV acquisition, the system 10 reduced FOV imaging using IVI enables a zoomed acquisition for a small ROI without suffering from aliasing artifacts and reduces the total acquisition time by a factor in proportion to the reduced number of k-space lines sampled. Furthermore, it is less sensitive to motion artifacts since less motion occurs within the shortened acquisition time.

One of the limitations of use of IVI is its susceptibility to B1 field inhomogeneities. The edges of the reduced-FOV images 503 are much darker than the center. These artifacts are reduced by using RF pulses with an improved slice profile, such as one with a larger number of side lobes or an adiabatic pulse, but this may significantly increase the pulse length or the power deposition. Furthermore, the IVI method is limited typically to work with sequences with spin-echo or TSE readout since the slice-selective gradient of the excitation pulse needs to be perpendicular to that of refocusing pulses.

Multidimensional spatially selective excitation (SSE), combining a multidimensional k-space trajectory with an RF pulse, is also used for reduced FOV imaging by confining excitation exclusively to a subvolume and by excluding signal generation in the outer volume. This method mitigates B1 inhomogeneities at high field, which is particularly useful for CEST imaging. However, SSE pulses are typically several tens of milliseconds and hence are susceptible to off-resonance effects and relaxation processes. The limitation of long pulse durations is overcome by using parallel excitation and transmit SENSE (Sensitivity encoding for MRI). The k-space trajectories are undersampled by exploiting the spatial information contained in individual coil element's B1 profile to reduce pulse durations. The RF waveforms for pTX in a small-tip-angle regime are calculated based on Grissom W, Yip C-Y, Noll D C. A method for the design of RF pulses in Transmit SENSE, Proceedings of the 2nd International Workshop on Parallel Imaging, Zurich, Switzerland 2004, page 95.

Figure 6:
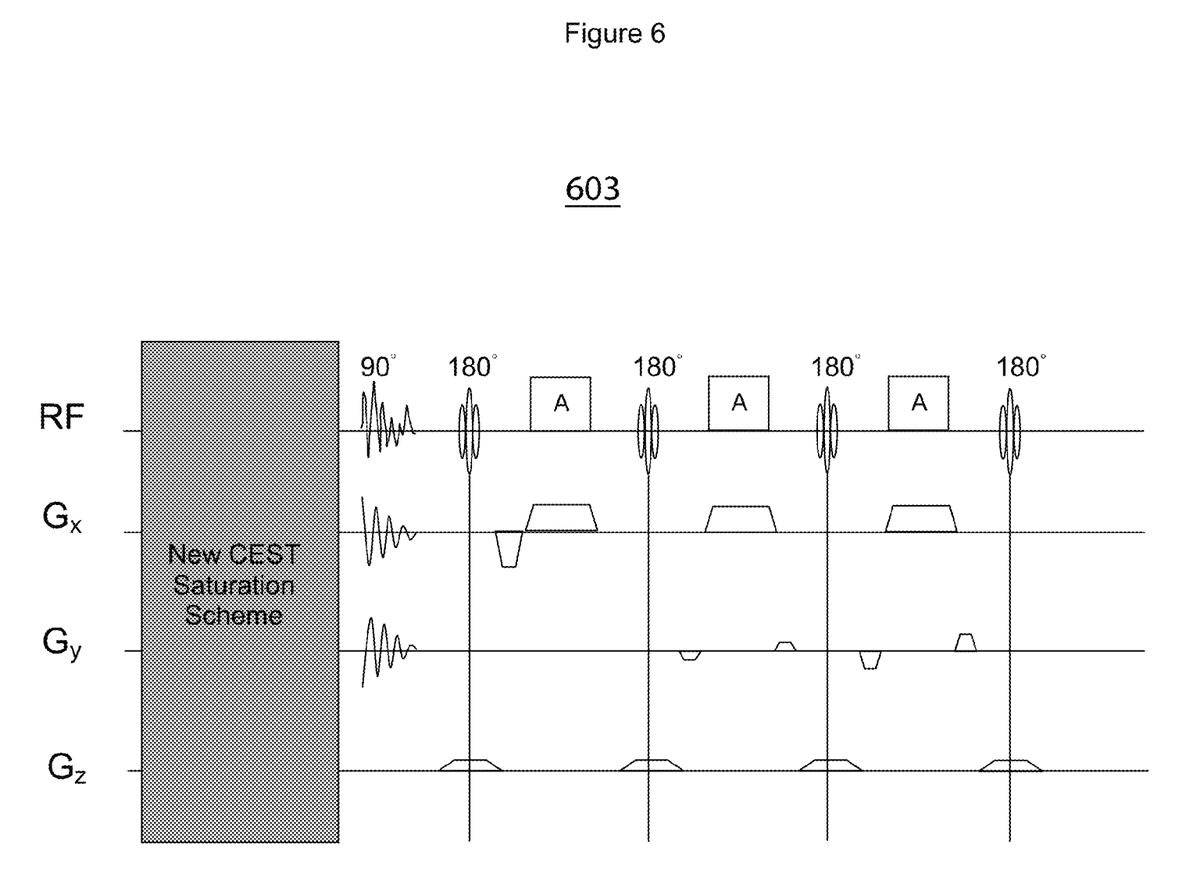
FIG. 6 shows a pulse sequence for CEST with parallel transmission concurrently applying a 90° RF excitation waveform and gradients Gx and Gy, according to an embodiment of the invention.

FIG. 6 shows pulse sequence 603 for reduced-FOV CEST-TSE with parallel transmission concurrently applying a 90° RF excitation waveform with calculated B1 waveform concurrent with gradients Gx and Gy. In one embodiment system 10 (FIG. 1) employs a k-space spiral trajectory (in a kx, ky 2D plane) for k-space element acquisition without encoding in a kz direction during a 90° RF excitation waveform in order to excite a high-resolution profile in the 2D (two dimensional) plane. The system provides different pulse sequences for image acquisition acceleration corresponding to changing the separation between k-space spiral arm trajectory turns for k-space element acquisition. Pulse sequence 603 increases the efficiency of CEST saturation and during the 90° excitation waveform, the gradients Gx and Gy are applied to excite a smaller FOV.

Returning to FIG. 1, magnetic fields generated by coils 12, 14 and 18 are used to acquire multiple individual frequency components corresponding to individual data elements in a k-space storage array. The individual frequency components are successively acquired in an order determined by processor 34. A storage processor in unit 34 stores individual frequency components acquired using the magnetic field in corresponding individual data elements in the array. Central control unit 26 uses information stored in an internal database to process the detected MR signals in a coordinated manner to generate high quality images of a selected slice (or slices) of the body and adjusts other parameters of system 10. The stored information comprises predetermined pulse sequence and magnetic field gradient and strength data as well as data indicating timing, orientation and spatial volume of gradient magnetic fields to be applied in imaging. Generated images are presented on display 40. Computer 28 includes a graphical user interface (GUI) enabling user interaction with central controller 26 and enables user modification of magnetic resonance imaging signals in substantially real time. Display processor 37 processes the magnetic resonance signals to provide image representative data for display on display 40, for example.

Figure 7:
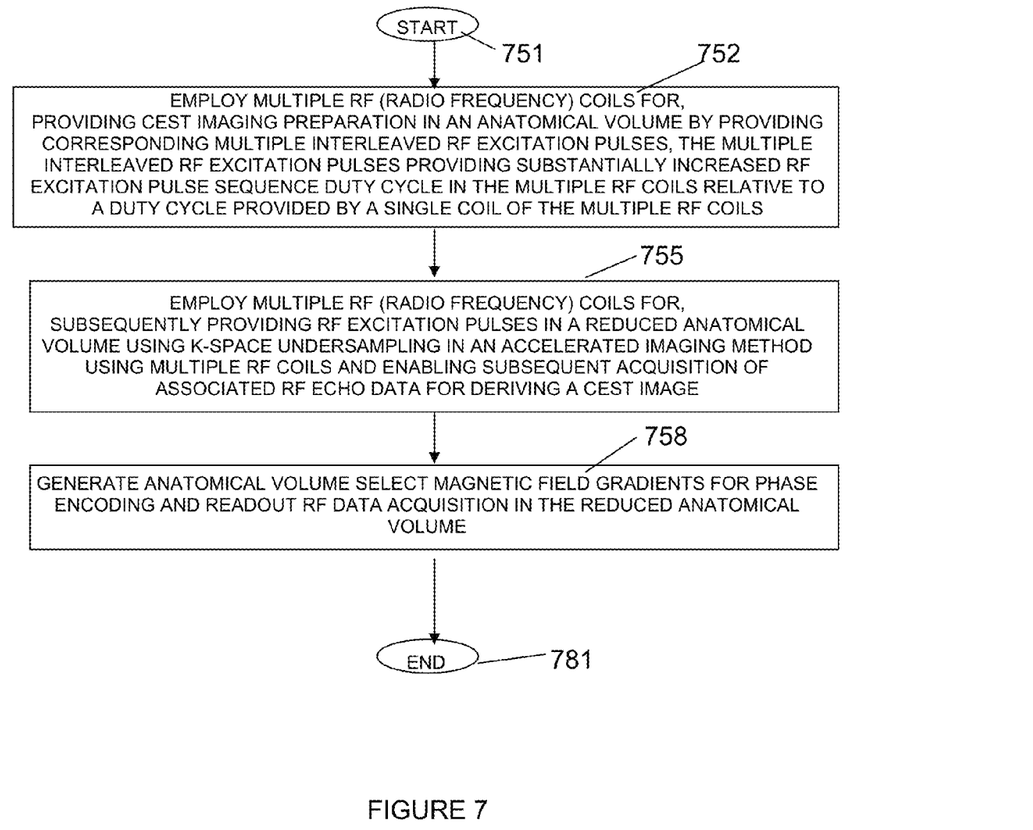
FIG. 7 shows a flowchart of a process used by an MR imaging system using multiple RF coils for reducing image acquisition time, suitable for chemical exchange saturation transfer (CEST) imaging, according to an embodiment of the invention.

FIG. 7 shows a flowchart of a process used by MR imaging system 10 (FIG. 1) using multiple RF coils for reducing image acquisition time, suitable for chemical exchange saturation transfer (CEST) imaging. In step 752 following the start at step 751, system 10 employs multiple RF (Radio Frequency) coils 18 for, providing CEST imaging preparation in an anatomical volume by providing corresponding multiple interleaved RF excitation pulses. The multiple interleaved RF excitation pulses provide substantially increased RF excitation pulse sequence duty cycle in multiple RF coils 18 relative to a duty cycle provided by a single coil of multiple RF coils 18. System 10 in step 755 employs multiple RF (Radio Frequency) coils 18 for subsequently providing RF excitation pulses in a reduced anatomical volume using k-space undersampling in an accelerated imaging method using the multiple RF coils 18 and enabling subsequent acquisition of associated RF echo data for deriving a CEST image.

In one embodiment, the multiple interleaved RF excitation pulses comprise individual sequences of pulses having substantially equal duty cycle. The individual sequences of pulses are delayed relative to one another to substantially maximize duty cycle of RF excitation pulses in multiple RF coils 18 and the anatomical volume. The multiple interleaved RF excitation pulses provide duty cycle of RF excitation in the plurality of RF coils exceeding 50%. The accelerated imaging method comprises a transmit SENSE (SENSitivity Encoding) compatible method. Field gradient coils 14 in step 758 generate anatomical volume select magnetic field gradients for phase encoding and readout RF data acquisition in the reduced anatomical volume. The process of FIG. 7 terminates at step 781

A processor as used herein is a device for executing machine-readable instructions stored on a computer readable medium, for performing tasks and may comprise any one or combination of, hardware and firmware. A processor may also comprise memory storing machine-readable instructions executable for performing tasks. A processor acts upon information by manipulating, analyzing, modifying, converting or transmitting information for use by an executable procedure or an information device, and/or by routing the information to an output device. A processor may use or comprise the capabilities of a computer, controller or microprocessor, for example, and is conditioned using executable instructions to perform special purpose functions not performed by a general purpose computer. A processor may be coupled (electrically and/or as comprising executable components) with any other processor enabling interaction and/or communication therebetween. A user interface processor or generator is a known element comprising electronic circuitry or software or a combination of both for generating display images or portions thereof. A user interface comprises one or more display images enabling user interaction with a processor or other device.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters. A graphical user interface (GUI), as used herein, comprises one or more display images, generated by a display processor and enabling user interaction with a processor or other device and associated data acquisition and processing functions.

The UI also includes an executable procedure or executable application. The executable procedure or executable application conditions the display processor to generate signals representing the UI display images. These signals are supplied to a display device which displays the image for viewing by the user. The executable procedure or executable application further receives signals from user input devices, such as a keyboard, mouse, light pen, touch screen or any other means allowing a user to provide data to a processor. The processor, under control of an executable procedure or executable application, manipulates the UI display images in response to signals received from the input devices. In this way, the user interacts with the display image using the input devices, enabling user interaction with the processor or other device. The functions and process steps herein may be performed automatically or wholly or partially in response to user command. An activity (including a step) performed automatically is performed in response to executable instruction or device operation without user direct initiation of the activity.

Definitions

EPI=Echo planar imaging involves image acquisition whereby a complete image is formed from a single data sample (k-space lines are acquired in one repetition time) of a gradient echo or spin echo sequence.

An inversion recovery (IR) pulse inverts longitudinal magnetization from the positive z-axis by 180 degrees to the negative z-axis. IR pulses are used as preparation pulses prior to a main imaging pulse sequence to achieve different kinds of MR contrast (such as T1 weighted, T2 weighted). Adiabatic IR pulses are used to give more uniform contrast throughout an imaging volume than non-adiabatic RF pulses.

iPAT (integrated Parallel Acquisition Techniques) comprises "parallel imaging". It enables faster scanning through reduced phase encoding and addition of RF coil information. An iPAT factor of 2 enables scanning about twice as fast, iPAT factor of 3 enables scanning about three times as fast and so on.

TI comprises inversion time, the time between an inversion recovery pulse and the next RF excitation pulse. TI determines the image contrast.

$T_1$ comprises the longitudinal (or spin-lattice) relaxation time $T_1$ decay constant.

$T_2$ comprises the transverse (or spin-spin) relaxation time $T_2$ is the decay constant for a proton spin component.

TR comprises repetition time, the time between successive RF excitation pulses.

FA comprises flip angle, i.e., an RF flip angle. For an inversion pulse, FA=180 degrees.

A saturation pulse (or saturation recovery pulse) comprises an RF pulse, typically 90 degrees (or any odd multiple of 90 degrees). Some systems use a spoiler gradient after the RF pulse. In a particular type of partial saturation pulse sequence a preceding pulse leaves the spins in a state of saturation, so that recovery at the time of the next pulse has taken place from an initial condition of no magnetization.
Segmented data acquisition records the different parts of raw data space (the segments) in a periodic fashion by repeatedly playing out a pulse sequence comprising an inversion pulse sequence and MR data acquisition pulses and acquiring a different set of k-space lines during readout (acquisition).

B0 is the main static base MRI magnetic field.

B1 is the RF transmit coil field.

The system and processes of FIGS. 1-7 are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. The system improves a CEST saturation effect, shortens total imaging time and reduces sensitivity to B1 (RF) field artifacts by using parallel transmission (pTX) and reduced FOV imaging. Further, the processes and applications may, in alternative embodiments, be located on one or more (e.g., distributed) processing devices on a network linking the units of FIG. 1. Any of the functions and steps provided in FIGS. 1-7 may be implemented in hardware, software or a combination of both. No claim element herein is to be construed under the provisions of 35 U.S.C. 112, sixth paragraph, unless the element is expressly recited using the phrase "means for."

What is claimed is:

1. An MR imaging system using a plurality of RF coils, for reducing image acquisition time, suitable for chemical exchange saturation transfer (CEST) imaging, comprising:
   a plurality of RF (Radio Frequency) coils,
   providing CEST imaging preparation in an anatomical volume by providing a corresponding plurality of interleaved RF excitation pulses, said plurality of interleaved RF excitation pulses providing substantially increased RF excitation pulse sequence duty cycle in said plurality of RF coils relative to a duty cycle provided by a single coil of said plurality of RF coils and
   subsequently providing RF excitation pulses in a reduced anatomical volume using k-space undersampling and inner volume imaging in an accelerated imaging method using the plurality of RF coils and enabling subsequent acquisition of associated RF echo data for deriving a CEST image.

2. A system according to claim 1, wherein
the plurality of interleaved RF excitation pulses comprise individual sequences of pulses having substantially equal duty cycle, said individual sequences of pulses being delayed relative to one another to substantially maximize duty cycle of RF excitation pulses in said plurality of RF coils and said anatomical volume.

3. A system according to claim 2, wherein
said plurality of interleaved RF excitation pulses provide duty cycle of RF excitation in said plurality of RF coils exceeding 50%.

4. A system according to claim 1, wherein
said accelerated imaging method comprises a transmit SENSE (SENSitivity Encoding) compatible method.

5. A method for MR imaging using a plurality of RF coils, for reducing image acquisition time, suitable for chemical exchange saturation transfer (CEST) imaging, comprising the activities of:
   employing a plurality of RF (Radio Frequency) coils for,
   providing CEST imaging preparation in an anatomical volume by providing a corresponding plurality of interleaved RF excitation pulses, said plurality of interleaved RF excitation pulses providing substantially increased RF excitation pulse sequence duty cycle in said plurality of RF coils relative to a duty cycle provided by a single coil of said plurality of RF coils and
   subsequently providing RF excitation pulses in a reduced anatomical volume using k-space undersampling and inner volume imaging in an accelerated imaging method using the plurality of RF coils and enabling subsequent acquisition of associated RF echo data for deriving a CEST image.

6. A method according to claim 5, wherein
the plurality of interleaved RF excitation pulses comprise individual sequences of pulses having substantially equal duty cycle, said individual sequences of pulses being delayed relative to one another to substantially maximize duty cycle of RF excitation pulses in said plurality of RF coils and said anatomical volume.

7. A method according to claim 5, wherein
said plurality of interleaved RF excitation pulses provide duty cycle of RF excitation in said plurality of RF coils exceeding 50%.

8. A method according to claim 5, wherein
said accelerated imaging method comprises a transmit SENSE (SENSitivity Encoding) compatible method.

9. A tangible storage medium for storage of non-transitory programmed instructions comprising a method for using a plurality of RF coils, for reducing image acquisition time, suitable for chemical exchange saturation transfer (CEST) imaging, comprising the activities of:
   employing a plurality of RF (Radio Frequency) coils for,
   providing CEST imaging preparation in an anatomical volume by providing a corresponding plurality of interleaved RF excitation pulses, said plurality of interleaved RF excitation pulses providing substantially increased RF excitation pulse sequence duty cycle in said plurality of RF coils relative to a duty cycle provided by a single coil of said plurality of RF coils and
   subsequently providing RF excitation pulses in a reduced anatomical volume using k-space undersampling and inner volume imaging in an accelerated imaging method using the plurality of RF coils and enabling subsequent acquisition of associated RF echo data for deriving a CEST image.

10. A tangible storage medium according to claim 9, wherein
the plurality of interleaved RF excitation pulses comprise individual sequences of pulses having substantially equal duty cycle, said individual sequences of pulses being delayed relative to one another to substantially maximize duty cycle of RF excitation pulses in said plurality of RF coils and said anatomical volume.

11. A tangible storage medium according to claim 9, wherein
said plurality of interleaved RF excitation pulses provide duty cycle of RF excitation in said plurality of RF coils exceeding 50%.

* * * * *